(12) United States Patent
Yang et al.

(10) Patent No.: US 11,849,559 B2
(45) Date of Patent: Dec. 19, 2023

(54) INTERCONNECTION STRUCTURE USED IN ELECTRONIC DEVICE AND METHOD FOR ASSEMBLING INTERCONNECTION STRUCTURE

(71) Applicant: HUAWEI TECHNOLOGIES CO., LTD., Guangdong (CN)

(72) Inventors: Xuguang Yang, Dongguan (CN); Zhiwen Yang, Dongguan (CN); Shaohua Zhang, Shenzhen (CN); Zelong Jiao, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/732,665

(22) Filed: Apr. 29, 2022

(65) Prior Publication Data
US 2022/0256727 A1    Aug. 11, 2022

Related U.S. Application Data
(63) Continuation of application No. PCT/CN2020/122619, filed on Oct. 22, 2020.

(30) Foreign Application Priority Data

Nov. 1, 2019    (CN) .......................... 201911061133.9

(51) Int. Cl.
*H05K 7/14*    (2006.01)
(52) U.S. Cl.
CPC ......... *H05K 7/1489* (2013.01); *H05K 7/1491* (2013.01)
(58) Field of Classification Search
CPC ............... H05K 7/1489; H05K 7/1491; H05K 7/20572; H05K 7/20736; H05K 7/20127; H05K 7/20145
See application file for complete search history.

(56) References Cited

U.S. PATENT DOCUMENTS

2002/0182899 A1* 12/2002 Debord ................ H05K 1/14
  439/65
2003/0223193 A1* 12/2003 Smith ............... H05K 7/20736
  361/679.48

(Continued)

FOREIGN PATENT DOCUMENTS

| CN | 102510707 A | 6/2012 |
|----|-------------|--------|
| CN | 103841792 A | 6/2014 |

(Continued)

OTHER PUBLICATIONS

Extended European Search Report dated Oct. 17, 2022 issued for European Application No. 20883588.4 (10 pages).

(Continued)

*Primary Examiner* — Anthony Q Edwards
*Assistant Examiner* — Hung Q Dang

(57) ABSTRACT

An interconnection structure used in an electronic device includes a chassis, a first line board, a second line board, and a heat dissipation component. The heat dissipation component is disposed on a first side surface of the chassis, the first side surface includes a first opening, the second line board is horizontally disposed inside the chassis, the first line board is vertically inserted onto a side surface of the second line board, and a second side surface that is of the chassis and that is opposite to the first side surface includes a second opening. The second line board is horizontally disposed inside the chassis, and the first line board is vertically inserted onto the side surface of the second line board, to reduce a quantity of parts on a system air duct, reduce a flow resistance of a system, and improve a heat dissipation capability of the system.

16 Claims, 14 Drawing Sheets

(56) References Cited

U.S. PATENT DOCUMENTS

| | | | |
|---|---|---|---|
| 2006/0133033 A1* | 6/2006 | Straub, Jr. ......... | H05K 7/20563 361/690 |
| 2007/0223209 A1* | 9/2007 | Tracewell ............ | H05K 9/0062 361/816 |
| 2010/0159816 A1 | 6/2010 | Huels et al. | |
| 2016/0174412 A1* | 6/2016 | Karaaslan .......... | H05K 7/20563 361/692 |

FOREIGN PATENT DOCUMENTS

| | | |
|---|---|---|
| CN | 204539679 U | 8/2015 |
| CN | 110267482 A | 9/2019 |

OTHER PUBLICATIONS

International Search Report dated Jan. 13, 2021 issued for International Application No. PCT/CN2020/122619 (11 pages).

\* cited by examiner

INTERCONNECTION STRUCTURE USED IN ELECTRONIC DEVICE AND METHOD FOR ASSEMBLING INTERCONNECTION STRUCTURE

CROSS-REFERENCE TO RELATED APPLICATIONS

This application is a continuation of International Application No. PCT/CN2020/122619, filed on Oct. 22, 2020, which claims priority to Chinese Patent Application No. 201911061133.9, filed on Nov. 1, 2019. The disclosures of the aforementioned applications are hereby incorporated by reference in their entireties.

TECHNICAL FIELD

This disclosure relates to the electronic field, and in particular, to an interconnection structure used in an electronic device and a method for assembling an interconnection structure.

BACKGROUND

With advent of a big data era, an electronic device is required to have an increasingly high capability, and power consumption of a chip used by the electronic device and power consumption of an entire board are greatly increased, posing challenges in terms of heat dissipation, power distribution, high-speed link design, and an entire-system architecture. How to improve a heat dissipation capability of an air cooling system becomes a major challenge in system architecture design of the electronic device.

SUMMARY

Embodiments of this disclosure provide an interconnection structure used in an electronic device and a method for assembling an interconnection structure, to resolve a problem provided by a related technology. Technical solutions are as follows:

According to one aspect, an interconnection structure used in an electronic device is provided. The interconnection structure used in the electronic device includes a chassis, a first line board, a second line board, and a heat dissipation component. The heat dissipation component is disposed on a first side surface of the chassis, the first side surface includes a first opening, the second line board is horizontally disposed inside the chassis, the first line board is vertically inserted onto a side surface of the second line board, and a second side surface that is of the chassis and that is opposite to the first side surface includes a second opening.

The second line board is horizontally disposed inside the chassis, and the first line board is vertically inserted onto the side surface of the second line board, to reduce a quantity of parts on a system air duct, reduce a flow resistance of a system, and improve a heat dissipation capability of the system.

In an example embodiment, the interconnection structure used in the electronic device includes one second line board, and first line boards include one group of switch fabric units (SFUs) and one group of line processing units (LPUs). The group of SFUs is vertically inserted onto a first side surface of the second line board, the group of LPUs is vertically inserted onto a second side surface of the second line board, the first side surface and the second side surface of the second line board are two opposite side surfaces, and the first side surface and the second side surface of the second line board are perpendicular to the first side surface and the second side surface of the chassis.

In an example embodiment, the interconnection structure used in the electronic device includes one second line board, and first line boards include one group of switch fabric units (SFUs) and two groups of line processing units (LPUs). The group of SFUs and the two groups of LPUs are separately inserted onto a same side surface of the second line board, and the group of SFUs is located between the two groups of LPUs.

The SFUs and the LPUs are separately inserted onto the same side surface of the second line board, to further save space.

In an example embodiment, the interconnection structure used in the electronic device includes at least two second line boards, and first line boards include at least one group of SFUs and two groups of LPUs. Each of the at least one group of SFUs is inserted between two of the at least two second line boards, and each of the two groups of LPUs is inserted onto an outer side of one of the at least two second line boards.

In an example embodiment, the at least two second line boards include the $1^{st}$ second line board and the $2^{nd}$ second line board, the two groups of LPUs include the first group of LPUs and the second group of LPUs, and the at least one group of SFUs includes one group of SFUs. The group of SFUs is inserted onto a first side surface of the $1^{st}$ second line board and a second side surface of the $2^{nd}$ second line board. The first group of LPUs is inserted onto a second side surface of the $1^{st}$ second line board, and the second group of LPUs is inserted onto a first side surface of the $2^{nd}$ second line board.

In an example embodiment, first connectors configured to connect to the first line board exist on two sides of the second line board, second connectors configured to connect to the second line board exist on two sides of the first line board, and the first line board and the second line board are connected to each other by using the first connectors and the second connectors.

In an example embodiment, the first line board includes a panel mechanical part, a baseplate mechanical part, a printed circuit board (PCB) located on the baseplate mechanical part, at least one second connector board, and a PCB board connector. The second connector board has second connectors connected to the second line board, and the second connector is connected to the PCB by using a cable.

The PCB board connector is disposed on a first side surface of the baseplate mechanical part, the panel mechanical part is connected to a second side surface of the baseplate mechanical part, the second connector board is separately disposed on a third side surface and a fourth side surface of the baseplate mechanical part, the second side surface of the baseplate mechanical part is opposite to the first side surface of the baseplate mechanical part, and the third side surface of the baseplate mechanical part is opposite to the fourth side surface of the baseplate mechanical part.

In an example embodiment, the second line board includes at least one of a PCB and a cable board.

In an example embodiment, the PCB includes a PCB, and first connectors configured to connect to the first line board exist on two side surfaces of the PCB.

In an example embodiment, the cable board includes a second line board mechanical part, first connectors configured to connect to the first line board exist on two side surfaces of the second line board mechanical part, and the first connectors on the two side surfaces of the second line board mechanical part are connected to each other by using a cable.

In an example embodiment, first connectors located in a same slot are fastened to form a movable connector subassembly, and the cable board further includes guide rails adapted to corresponding movable connector subassemblies on two side surfaces. The first line board further includes a matrix connection mechanism, for example, a matrix insertion/removal mechanism, configured to hold the movable connector subassembly.

In an example embodiment, the PCB has a cable connector, and the PCB is connected to a cable between the second connectors by using the cable connector.

A method for assembling an interconnection structure is further provided. The interconnection structure is an interconnection structure used in an electronic device, and the interconnection structure used in the electronic device includes a chassis, a first line board, a second line board, and a heat dissipation component.

The method includes:
disposing the heat dissipation component on a first side surface of the chassis, where the first side surface includes a first opening;
horizontally disposing the second line board inside the chassis; and
vertically inserting the first line board onto a side surface of the second line board, where a second side surface that is of the chassis and that is opposite to the first side surface includes a second opening.

In an example embodiment, the interconnection structure used in the electronic device includes one second line board, and first line boards include one group of switch fabric units (SFUs) and one group of line processing units (LPUs); and
the vertically inserting the first line board onto a side surface of the second line board includes:
vertically inserting the group of SFUs onto a first side surface of the second line board, and vertically inserting the group of LPUs onto a second side surface of the second line board, where the first side surface and the second side surface of the second line board are two opposite side surfaces, and the first side surface and the second side surface of the second line board are perpendicular to the first side surface and the second side surface of the chassis.

In an example embodiment, the interconnection structure used in the electronic device includes one second line board, and first line boards include one group of SFUs and two groups of LPUs; and
the vertically inserting the first line board onto a side surface of the second line board includes:
separately inserting the group of SFUs and the two groups of LPUs onto a same side surface of the second line board, where the group of SFUs is located between the two groups of LPUs.

In an example embodiment, the interconnection structure used in the electronic device includes at least two second line boards, and first line boards include at least one group of SFUs and two groups of LPUs; and
the vertically inserting the first line board onto a side surface of the second line board includes:
inserting each of the at least one group of SFUs between two of the at least two second line boards, and inserting each of the two groups of LPUs onto an outer side of one of the at least two second line boards.

In an example embodiment, the at least two second line boards include the $1^{st}$ second line board and the $2^{nd}$ second line board, the two groups of LPUs include the first group of LPUs and the second group of LPUs, and the at least one group of SFUs includes one group of SFUs; and
the inserting each of the at least one group of SFUs between two of the at least two second line boards, and inserting each of the two groups of LPUs onto an outer side of one of the at least two second line boards includes:
inserting the group of SFUs onto a first side surface of the $1^{st}$ second line board and a second side surface of the $2^{nd}$ second line board; and
inserting the first group of LPUs onto a second side surface of the $1^{st}$ second line board, and inserting the second group of LPUs onto a first side surface of the $2^{nd}$ second line board.

In an example embodiment, first connectors configured to connect to the first line board exist on two sides of the second line board, second connectors configured to connect to the second line board exist on two sides of the first line board, and the first line board and the second line board are connected to each other by using the first connectors and the second connectors; and
the horizontally disposing the second line board inside the chassis includes:
inserting the first line board in place in a disposing direction of the second line board, and enabling the second connectors to cooperate with the first connectors on the second line board, so that the first line board is inserted relative to the second line board.

DESCRIPTION OF EMBODIMENTS

Terms used in embodiments of this disclosure are only used to explain specific embodiments of this disclosure, but are not intended to limit this disclosure.

With advent of a big data era, an electronic device of data is required to have an increasingly high capability. A plurality of types of first line boards such as a line processing unit (LPU), a switch fabric unit (SFU), and a field replaceable unit (FRU) often need to be disposed in an interconnection structure used in an electronic device. The LPU is directly connected to a user port as a data processing line board. The SFU is a line board for data forwarding inside the electronic device. The FRU is a component of the electronic device. A user or a technician can quickly and easily remove the FRU from the device and replace the FRU without sending the entire product for repair. In addition to the plurality of types of first line boards described above, the interconnection structure used in the electronic device includes a second line board. The second line board includes an internal cable and various connectors, and allows another first line board to be inserted and connected to the second line board. A connector is also referred to as a plug and a socket, and is usually an electrical connector, namely, a component connecting two active components and transmitting a current or a signal. In addition, the interconnection structure used in the electronic device further includes a physical entity including a subrack, a slot, a cooling and power supply module, and the like, to provide placement and interconnection space for components and protect the components.

Because power consumption of a chip used by the electronic device and power consumption of an entire board are gradually greatly increased, challenges in terms of heat dissipation, power distribution, high-speed link design, and an entire-system architecture are posed. Therefore, how to improve a heat dissipation capability of an air cooling system becomes a challenge in system architecture design of the electronic device.

Figure 1:
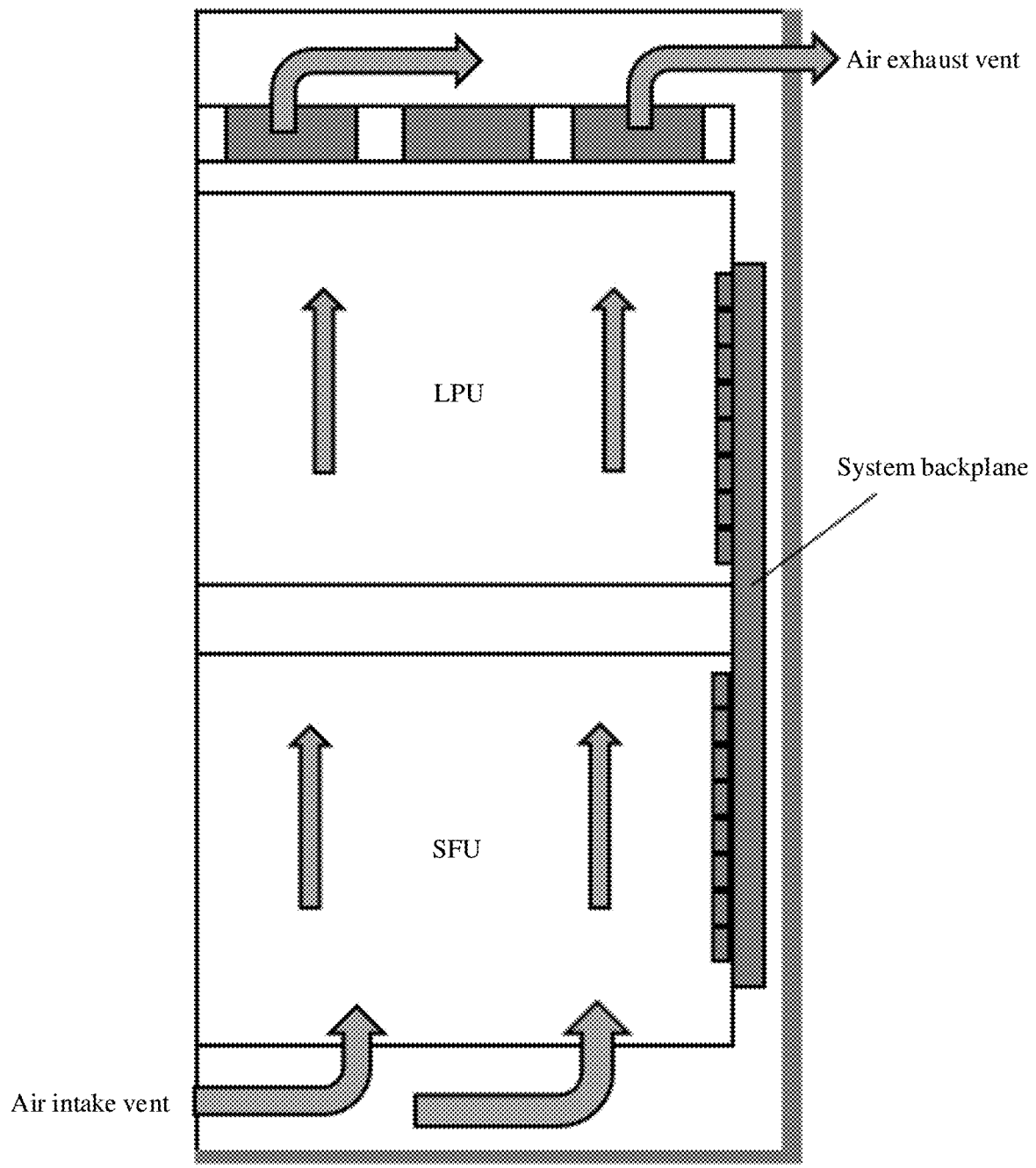
FIG. 1 is a schematic diagram of a system structure of an electronic device according to a related technology.
Figure 2:
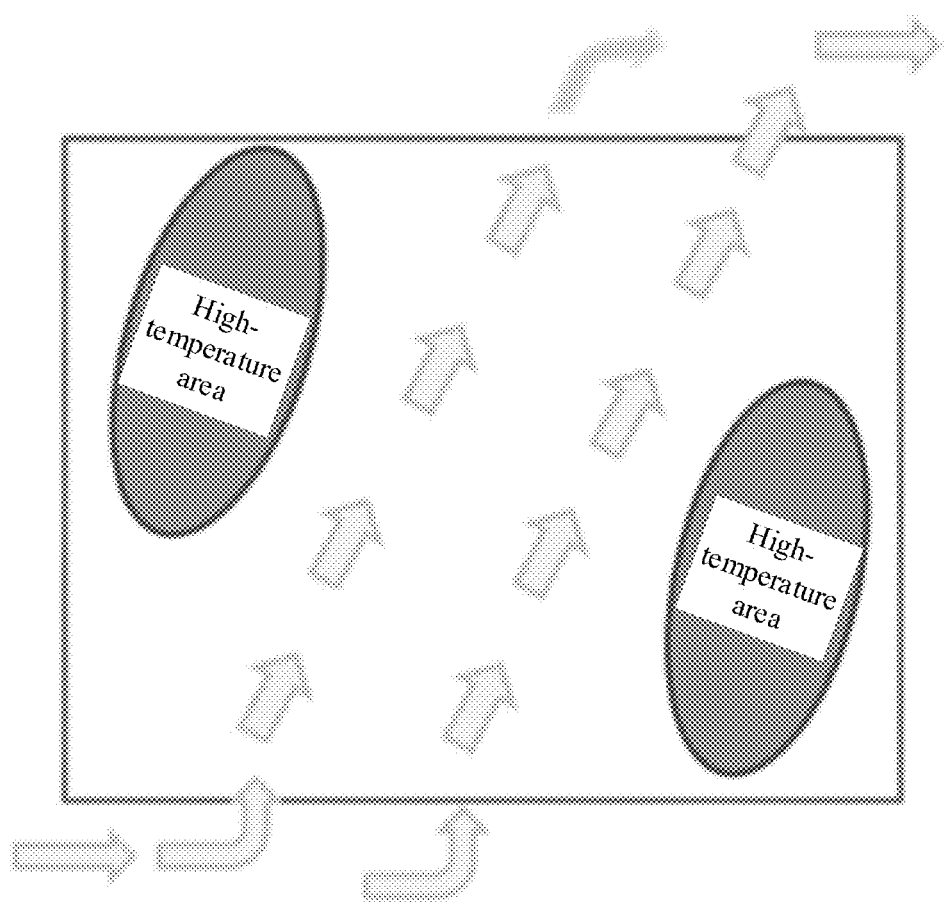
FIG. 2 is a schematic diagram of an air duct of a first line board according to a related technology.

In a related technology, as shown in FIG. 1, a second line board of an electronic device is placed on a rear part, first line boards such as an LPU and an SFU are inserted in a depth direction in front of the second line board, connectors at the bottom of the LPU and the SFU and a connector on the second line board are inserted relative to each other, and a fan is disposed at the top of the electronic device for blowing or is disposed at the bottom of the electronic device for blowing. A system air duct is a Z-shaped air duct in which air enters the air duct from a lower front part and air is exhausted from the top or an upper rear part. However, in a system architecture of the electronic device, sizes of an air intake vent and an air exhaust vent are limited, a flow resistance of the system is relatively large, and an overall heat dissipation capability is poor. In addition, as shown in FIG. 2, a vortex is easily generated at turns of the air duct, to form a high-temperature area, and heat dissipation of the first line board is uneven, which is unhelpful for a layout of the first line board.

Figure 3:
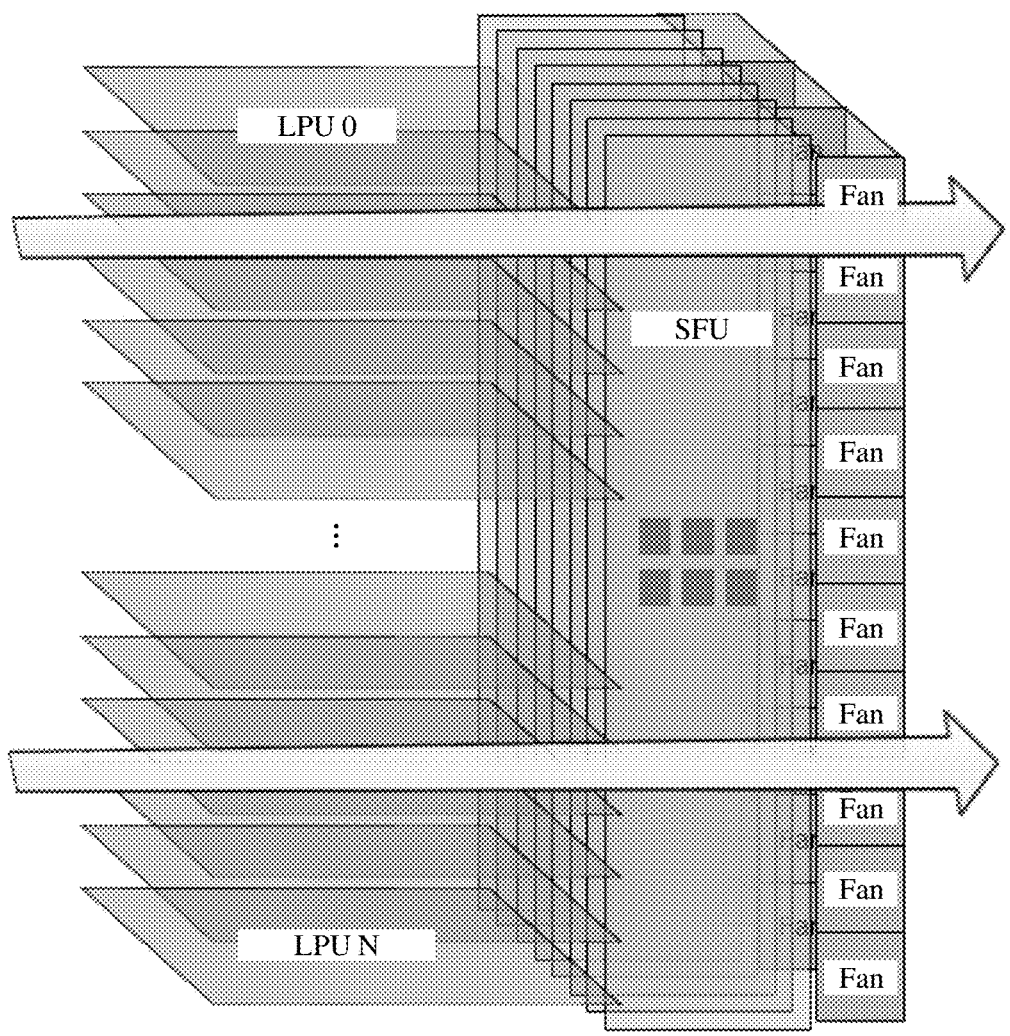
FIG. 3 is a schematic diagram of an interconnection structure that is used in an electronic device and that has no second line board according to a related technology.
Figure 4:
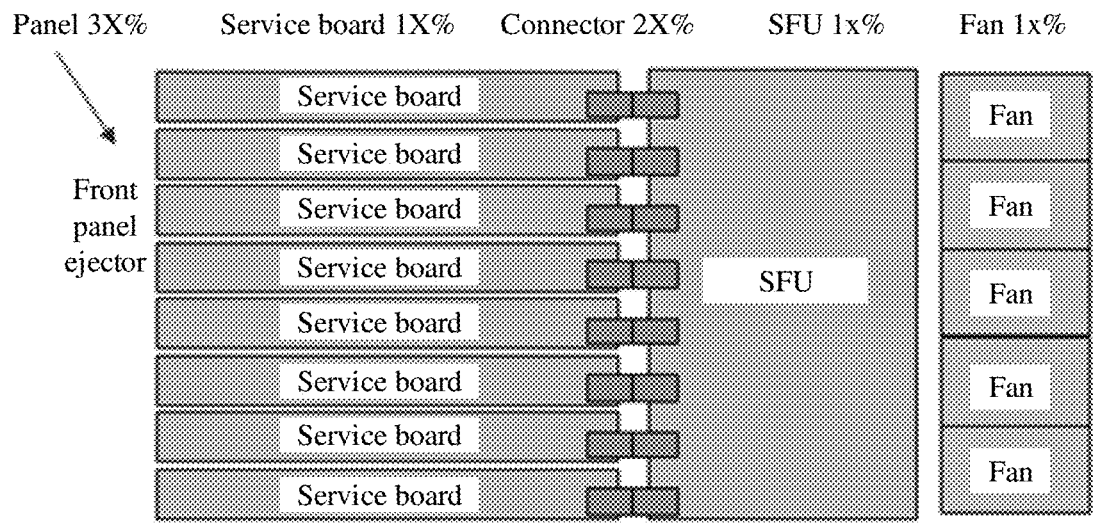
FIG. 4 is a schematic diagram of flow resistance distribution of an orthogonal architecture according to a related technology.

In another related technology, an orthogonal system architecture of an electronic device that has no second line board is provided. As shown in FIG. 3, first line boards named LPUs are horizontally inserted, SFUs and the LPUs are arranged in a 90-degree orthogonal layout, and a fan is installed behind the SFUs to exhaust air. An entire system air duct is a front-to-rear direct ventilation air duct, and air is exhausted from a rear part of the electronic device. It can be learned from FIG. 3 that in a front-to-rear direct ventilation system of the electronic device, each component in an air duct path blocks air and generates a system flow resistance. Therefore, an air volume of the entire system is affected, and a heat dissipation capability of the system is affected. For the system architecture shown in FIG. 3, proportions of flow resistances generated by the components in the entire system may be shown in FIG. 4. A proportion of a flow resistance of a connector in the entire system is relatively large, and the flow resistance imposes large impact on the heat dissipation capability of the system. A flow resistance generated by the SFU in the system air induct affects the heat dissipation capability of the system.

In view of this, an embodiment of this disclosure provides an interconnection structure used in an electronic device. Taking FIG. 5 as an example, the interconnection structure used in the electronic device includes a chassis 1, a first line board 2, a second line board 3, and a heat dissipation component 4.

The heat dissipation component 4 is disposed on a first side surface of the chassis 1, the first side surface includes a first opening, the second line board 3 is horizontally disposed inside the chassis 1, the first line board 2 is vertically inserted onto a side surface of the second line board 3, and a second side surface that is of the chassis 1 and that is opposite to the first side surface includes a second opening.

For example, the heat dissipation component 4 includes but is not limited to a blower or a fan. A type of the heat dissipation component 4 and a quantity of heat dissipation components 4 are not limited in this embodiment of this disclosure. In addition, in an example embodiment, the interconnection structure used in the electronic device may further include a case for accommodating the heat dissipation component 4. For example, when the heat dissipation component 4 is a blower, the interconnection structure used in the electronic device further includes a blower case for accommodating the blower.

Figure 5:
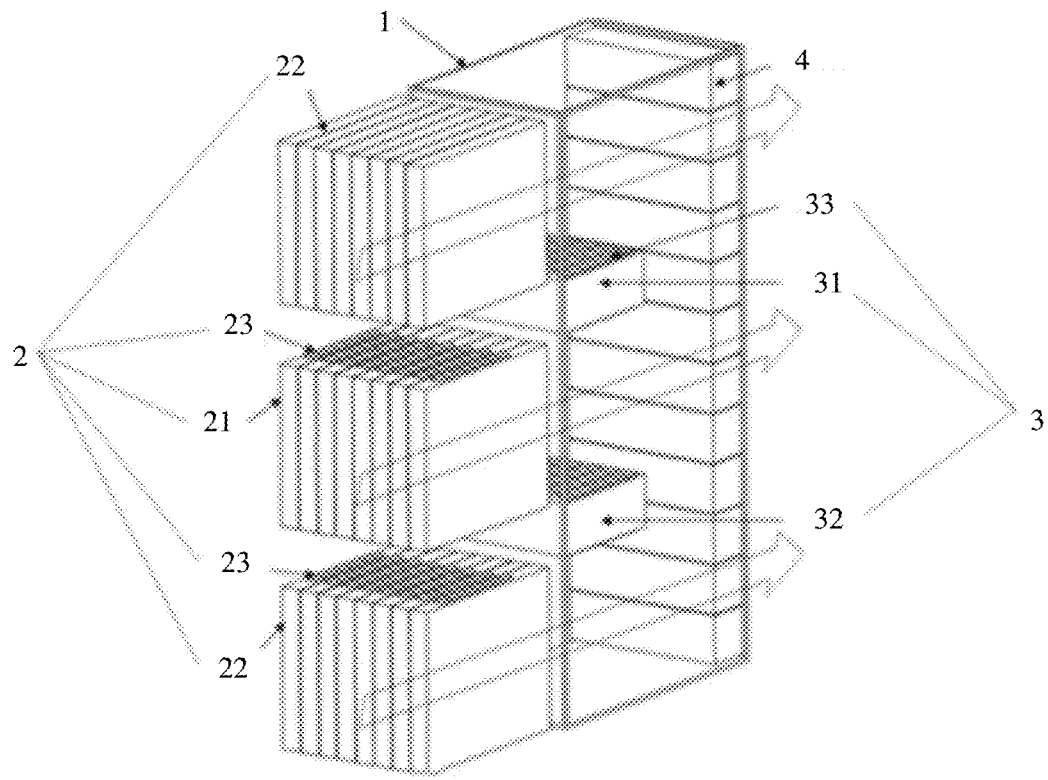
FIG. 5 is a schematic diagram of an interconnection structure used in an electronic device according to an example embodiment of this disclosure.

It should be noted that as shown in FIG. 5, that the second line board 3 is horizontally disposed inside the chassis 1 means that the second line board 3 is perpendicular to the first side surface. FIG. 5 is described only by using an example in which the electronic device includes two second line boards 3 and two groups of first line boards 2. In this embodiment of this disclosure, a type of the first line board 2 and a quantity of first line boards 2 are not limited, and a quantity of second line boards 3 and the quantity of heat dissipation components 4 are not limited, either. To enable all first line boards 2 to be inserted into the second line board 3, the quantity of second line boards 3 needs to depend on the quantity of first line boards 2.

For ease of understanding, an example in which first line boards include an LPU and an SFU is used. In this case, a front view of the interconnection structure that is used in the electronic device and that is shown in FIG. 5 may be shown in FIG. 6, and a side view of the interconnection structure that is used in the electronic device and that is shown in FIG. 5 may be shown in FIG. 7. In FIG. 5, a direction indicated by a hollow arrow is an air direction of a system air duct. It can be learned from FIG. 7 that air may enter the air duct from the first opening on the second side surface, flows through planes on which the first line board 2 and the second line board 3 are located inside the chassis 1, then flows through the heat dissipation component 4, and finally flows out from the second opening on the first side surface. In the entire system air duct, air enters the air duct from a front part and is exhausted from a rear part.

In the interconnection structure that is used in the electronic device and that is provided in this embodiment of this disclosure, the second line board 3 is horizontally disposed inside the chassis 1, and the first line board 2 is vertically inserted onto the side surface of the second line board 3, to reduce a quantity of parts on the system air duct, reduce a flow resistance of a system, and improve a heat dissipation capability of the system.

In an example embodiment, as shown in FIG. 5, the interconnection structure used in the electronic device includes at least two second line boards 3, and first line boards 2 include at least one group of SFUs 21 and two groups of LPUs 22. Each of the at least one group of SFUs 21 is inserted between two of the at least two second line boards 3, and each of the two groups of LPUs 22 is inserted into one of two second line boards 3 on an outer side of the at least two second line boards 3.

In this embodiment of this disclosure, a quantity of SFUs included in one group of SFUs 21 is not limited, and a quantity of LPUs 22 included in each group of LPUs 22 is not limited, either. The quantity of SFUs included in one group of SFUs 21 may be consistent with the quantity of LPUs 22 included in each group of LPUs 22. The quantity of second line boards 3 may be determined based on a quantity of SFUs 21 and a quantity of two groups of LPUs 22. Because the SFU 21 is used for data forwarding inside the electronic device, the SFU 21 may be disposed between a plurality of second line boards 3, and is separately connected to two second line boards 3. In addition, because the LPU 22 is directly configured to connect to a user port, each of the two groups of LPUs 22 is inserted into one of the two second line boards 3 on the outer side.

Figure 6:
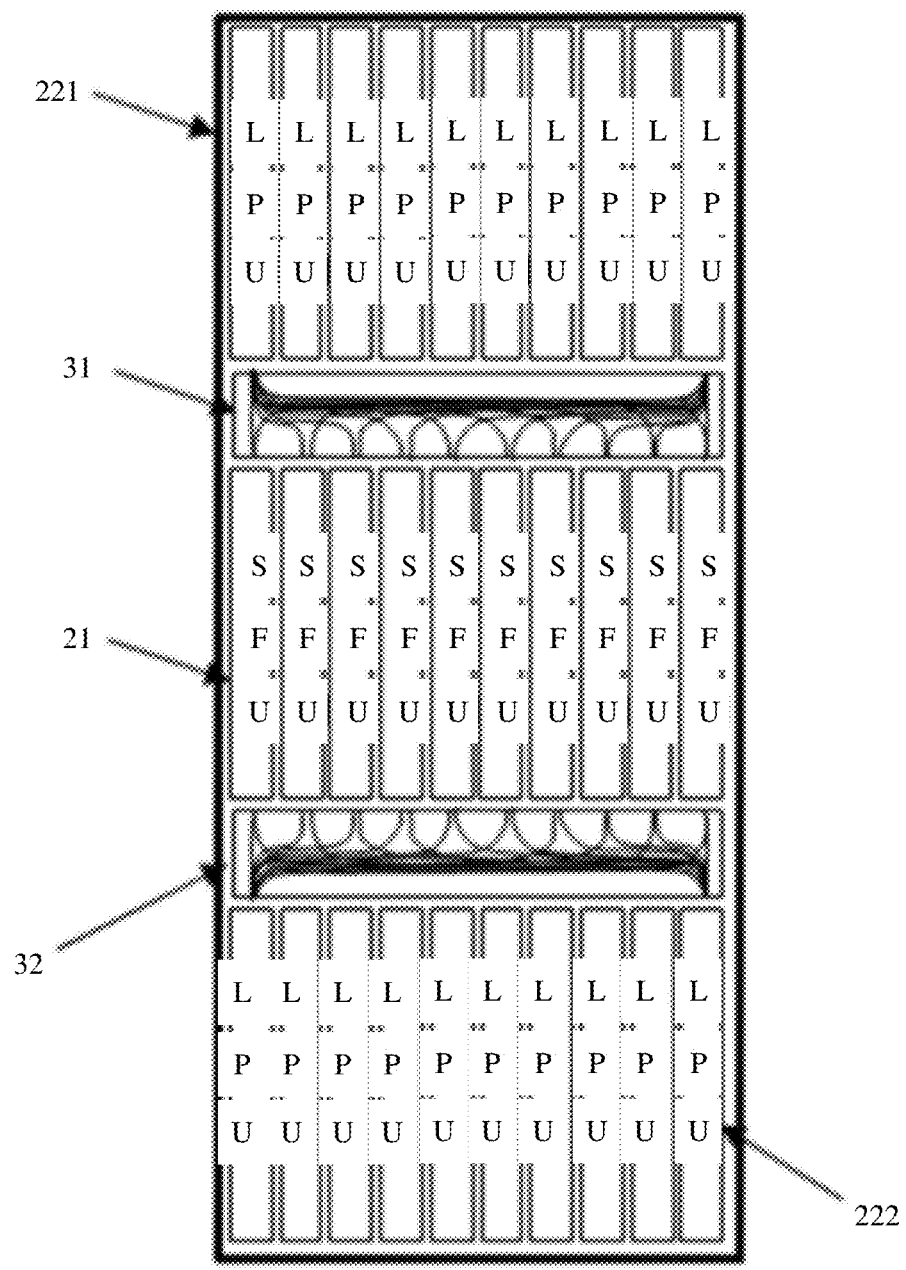
FIG. 6 is a front view of an interconnection structure used in an electronic device according to an example embodiment of this disclosure.
Figure 7:
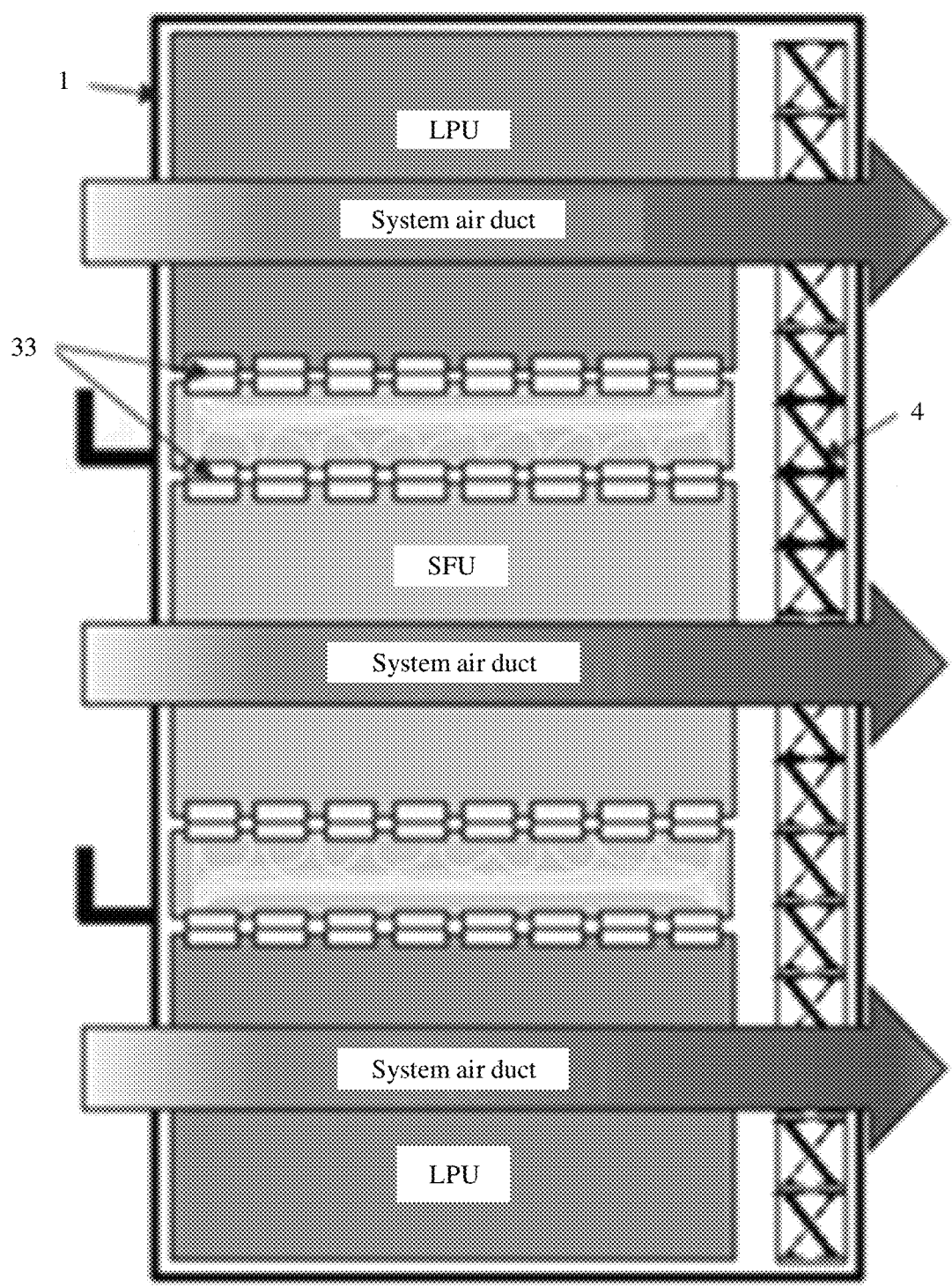
FIG. 7 is a side view of an interconnection structure used in an electronic device according to an example embodiment of this disclosure.

For example, as shown in FIG. 6, the at least two second line boards 3 include the $1^{st}$ second line board 31 and the $2^{nd}$ second line board 32, the two groups of LPUs 22 include the first group of LPUs 221 and the second group of LPUs 222, and the at least one group of SFUs 21 includes one group of SFUs 21.

The group of SFUs 21 is inserted onto a first side surface of the $1^{st}$ second line board 31 and a second side surface of the $2^{nd}$ second line board 32. The first group of LPUs 221 is inserted onto a second side surface of the $1^{st}$ second line board 31, and the second group of LPUs 222 is inserted onto a first side surface of the $2^{nd}$ second line board 32.

It should be noted that the foregoing describes merely several example embodiments. An architecture layout of the interconnection structure that is used in the electronic device and that is provided in this embodiment of this disclosure may be flexibly adjusted based on a quantity of first line boards supported by the product. For example, in an example embodiment, in addition to a manner in which the interconnection structure used in the electronic device includes two second line boards 3, the interconnection structure used in the electronic device may include one second line board 3 and two groups of first line boards 2, one group of first line boards 2 is vertically inserted onto a first side surface of the second line board 3, and the other group of first line boards 2 is vertically inserted onto a second side surface of the second line board 3. The first side surface and the second side surface of the second line board 3 are two opposite side surfaces, and the first side surface and the second side surface of the second line board 3 are perpendicular to the first side surface and the second side surface of the chassis 1.

Figure 8:
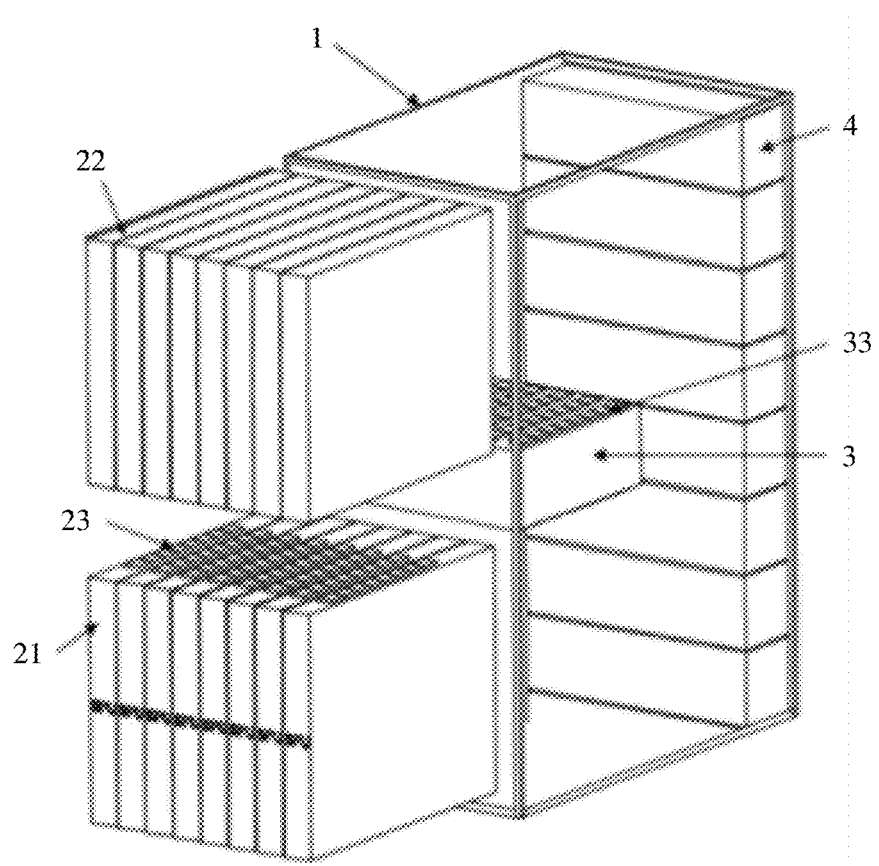
FIG. 8 is a schematic diagram of an interconnection structure used in an electronic device according to an example embodiment of this disclosure.

For example, in a layout implementation solution of upper and lower slot areas shown in FIG. 8, the interconnection structure used in the electronic device includes one second line board 3, and first line boards 2 include one group of SFUs 21 and one group of LPUs 22. The group of SFUs 21 is vertically inserted onto a first side surface of the second line board 3, the group of LPUs 22 is vertically inserted onto a second side surface of the second line board 3, the first side surface and the second side surface of the second line board 3 are two opposite side surfaces, and the first side surface and the second side surface of the second line board 3 are perpendicular to the first side surface and the second side surface of the chassis 1.

Figure 9:
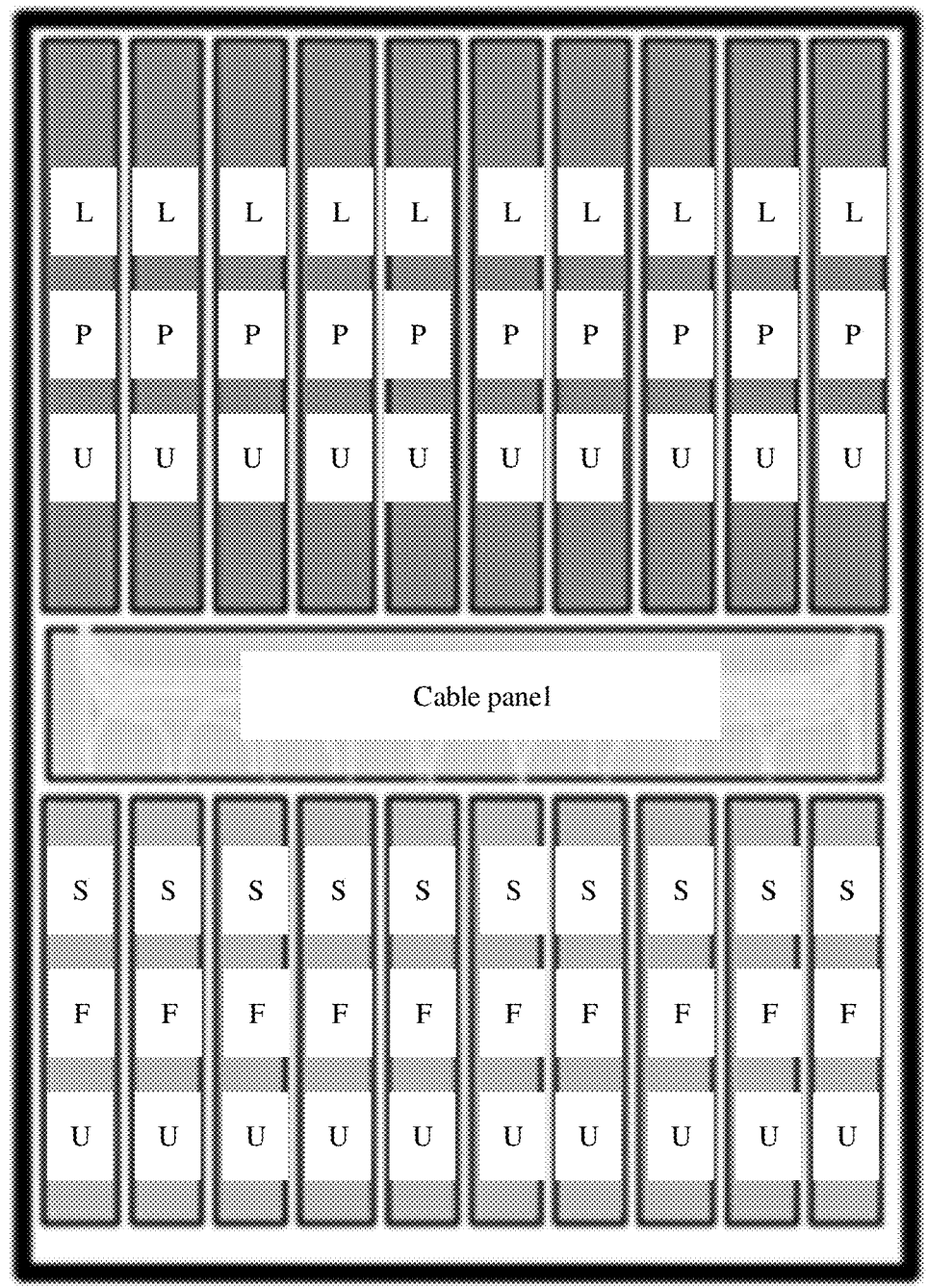
FIG. 9 is a front view of an interconnection structure used in an electronic device according to an example embodiment of this disclosure.
Figure 10:
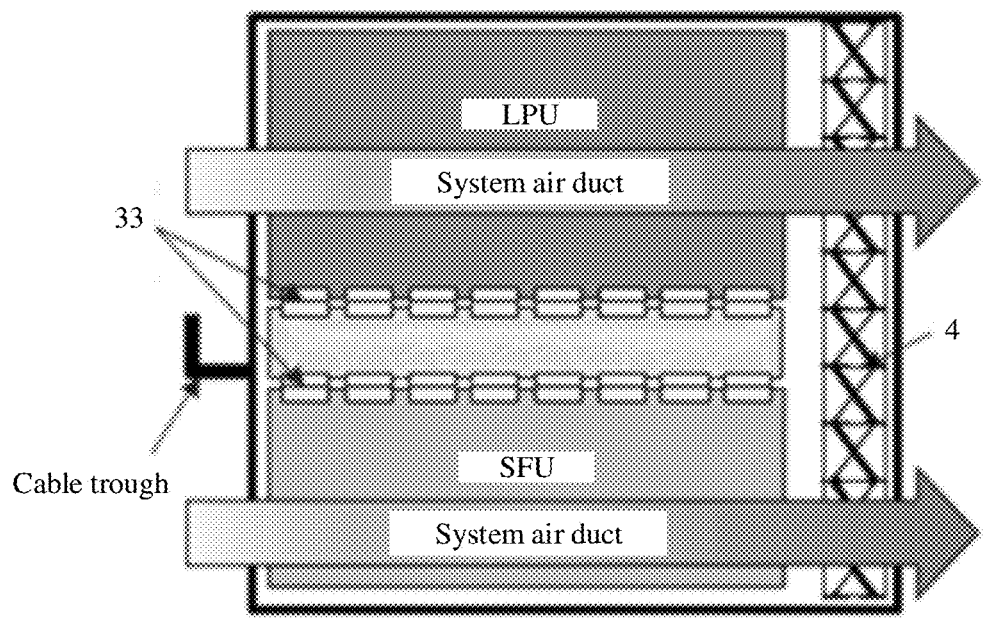
FIG. 10 is a side view of an interconnection structure used in an electronic device according to an example embodiment of this disclosure.

A front view of the interconnection structure that is used in the electronic device and that is shown in FIG. 8 may be shown in FIG. 9, and a side view of the interconnection structure that is used in the electronic device and that is shown in FIG. 8 may be shown in FIG. 10.

In an example embodiment, in the case in which the interconnection structure used in the electronic device includes one second line board 3 and two groups of first line boards 2, in addition to the manner shown in FIG. 8, the two groups of first line boards 2 may be vertically inserted onto a same side surface of the second line board 3, to further reduce a quantity of parts and space of the chassis 1.

Figure 11:
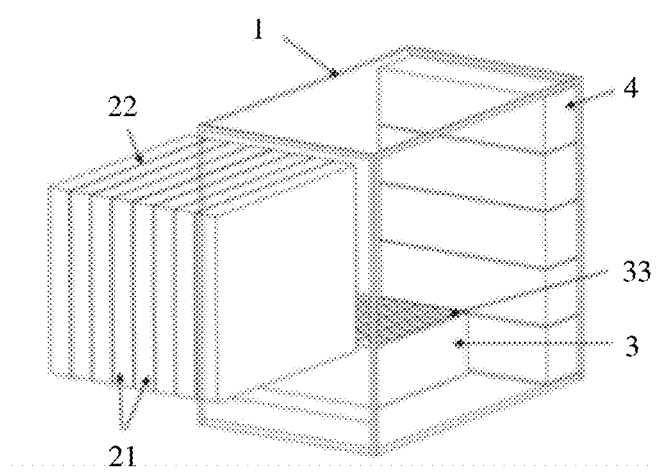
FIG. 11 is a schematic diagram of an interconnection structure used in an electronic device according to an example embodiment of this disclosure.

For example, as shown in FIG. 11, a product form with a smaller size and fewer slots is provided. The interconnection structure used in the electronic device includes one second line board 3, and first line boards 2 include one group of SFUs 21 and two groups of LPUs 22. The group of SFUs 21 and the two groups of LPUs 22 are separately inserted onto a same side surface of the second line board 3, and the group of SFUs 21 is located between the two groups of LPUs 22. In some embodiments, alternatively, the SFUs may not be located between the two groups of LPUs. A quantity of SFUs 21 included in one group of SFUs 21 and a quantity of LPUs 22 included in each group of LPUs 22 are not limited in this embodiment of this disclosure, and may be determined based on a requirement.

Figure 12:
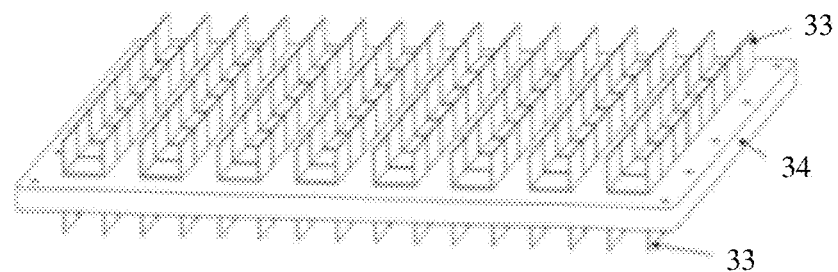
FIG. 12 is a schematic diagram of a structure of a second line board according to an example embodiment of this disclosure.

In all the interconnection structures used in the electronic device in FIG. 5 to FIG. 11, referring to FIG. 5, FIG. 8, and FIG. 12, first connectors 33 configured to connect to the first line board 2 exist on two sides of the second line board 3, second connectors 23 configured to connect to the second line board 3 exist on two sides of the first line board 2, and the first line board 2 and the second line board 3 are connected to each other by using the first connectors 33 and the second connectors 23. A quantity of first connector 33 and a quantity of second connector 23 may be determined based on a quantity of first line boards 2 connected to the second line board 3.

When the interconnection structure used in the electronic device is assembled, the first line board 2 may be first inserted in place in a disposing direction of the second line board 3, and then the second connectors 23 on a side surface cooperate with the first connectors 33 on the second line board 3, so that the first line board 2 is inserted relative to the second line board 3.

In an example embodiment, the second line board 3 includes at least one of a PCB and a cable board.

As shown in FIG. 12, the PCB includes a PCB 34, and first connectors 33 configured to connect to the first line board 2 exist on two side surfaces of the PCB 34.

In a relative insertion manner of the first line board 2 and the second line board 3, the first connector 33 on the PCB may be fixed. When the interconnection structure used in the electronic device is assembled, the first line board 2 may be first inserted in place in the disposing direction of the second line board 3, and then the second connectors 23 on the side surface cooperate with the first connectors 33 on the PCB, so that the first line board 2 is inserted relative to the second line board 3.

Figure 13:
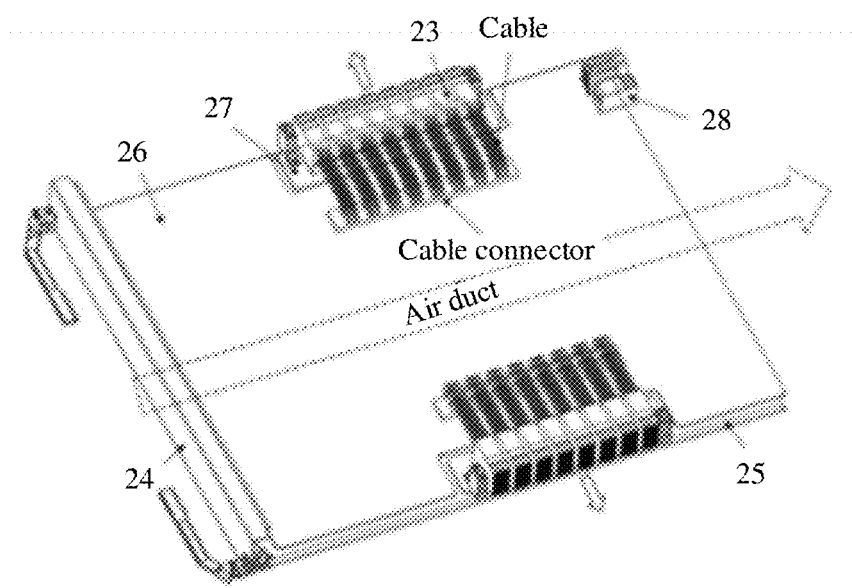
FIG. 13 is a schematic diagram of a structure of a first line board according to an example embodiment of this disclosure.

In an example embodiment, as shown in FIG. 13, the first line board 2 includes a panel mechanical part 24, a baseplate mechanical part 25, a PCB 26 located on the baseplate mechanical part 25, at least one second connector board 27, and a PCB board connector 28. The second connector board 27 has second connectors 23 connected to the second line board 3, and the second connector 23 is connected to the PCB 26 by using a cable.

The PCB board connector 28 is disposed on a first side surface of the baseplate mechanical part 25, the panel mechanical part 24 is connected to a second side surface of the baseplate mechanical part 25, the second connector board 27 is separately disposed on a third side surface and a fourth side surface of the baseplate mechanical part 25, the second side surface of the baseplate mechanical part 25 is opposite to the first side surface of the baseplate mechanical part 25, and the third side surface of the baseplate mechanical part 25 is opposite to the fourth side surface of the baseplate mechanical part 25.

It should be noted that FIG. 13 is only used to describe a structure of the first line board 2 by using an example. In addition to the foregoing parts, the first line board 2 includes a PCB board connector, and the PCB board connector is configured to supply power to the PCB and communicate with the PCB. The PCB board connector may connect the first line board 2 to a part other than the second line board 3 inside the chassis 1. In addition, to connect the second connector 23 and the PCB 26 by using the cable, the PCB 26 further includes a cable connector, and is connected to the cable by using the cable connector, to connect to the second connector 23 by using the cable.

When the PCB shown in FIG. 12 cooperates with the first line board 2 shown in FIG. 13, the second connector board 27 on the first line board 2 may move in a direction perpendicular to a side edge of the first line board 2, the first line board 2 is first inserted in place in a depth direction, and then the second connector board 27 moves toward the PCB 3 when being pushed by the mechanism, so that the first line board 2 is inserted relative to the PCB.

To facilitate insertion of the first line board 2 into the chassis 1, a push mechanism of the first line board 2 may be further disposed on the panel mechanical part 24 of the first line board 2. The push mechanism is pulled to insert the first line board 2 into the chassis 1 and pull the first line board 2 out of the chassis 1. In some embodiments, the push mechanism may be a gear and rack mechanism or a lever mechanism that is the same as a matrix connection mechanism.

Figure 15:
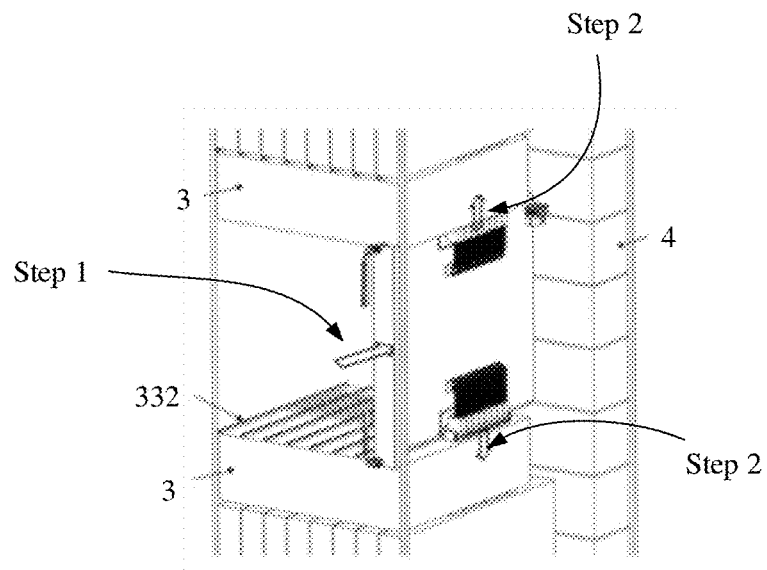
FIG. 15 is a schematic diagram of a process of inserting a first line board according to an example embodiment of this disclosure.

For the PCB, as shown in FIG. 15, when the first line board 2 is inserted, the first line board 2 is first inserted in place in a direction of step 1, and then second connectors 23 on two sides of the first line board 2 move in a direction of step 2 under an action of an insertion/removal mechanism (which is not shown in FIG. 15, and may be, for example, a matrix insertion/removal mechanism 29 in FIG. 17), to implement cooperation with the first connector 33.

Figure 14:
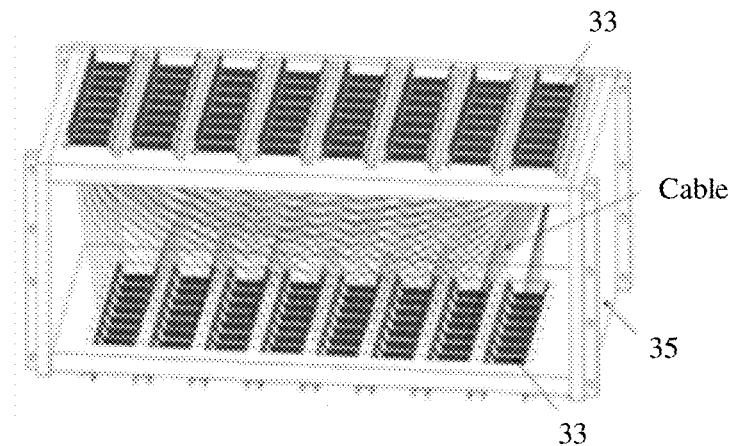
FIG. 14 is a schematic diagram of a structure of a second line board according to an example embodiment of this disclosure.

In an example embodiment, as shown in FIG. 14, the cable board includes a second line board mechanical part 35, first connectors 33 configured to connect to the first line board 2 exist on two side surfaces of the second line board mechanical part 35, and the first connectors 33 on the two side surfaces of the second line board mechanical part 35 are connected to each other by using a cable.

Figure 16:
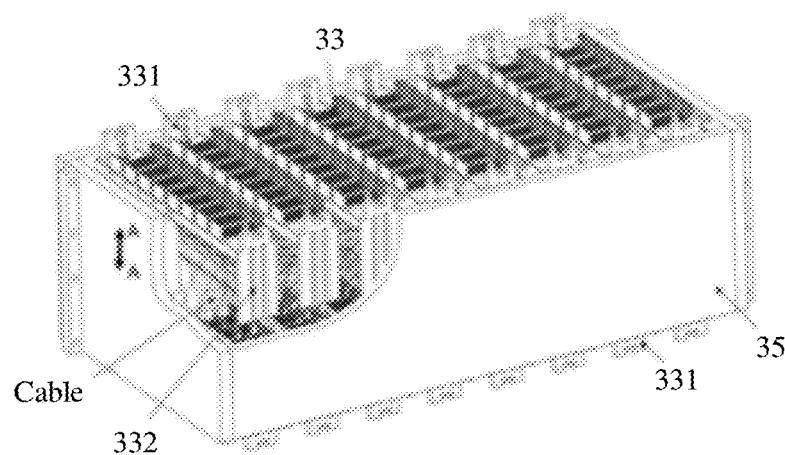
FIG. 16 is a schematic diagram of a structure of a second line board according to an example embodiment of this disclosure.
Figure 17:
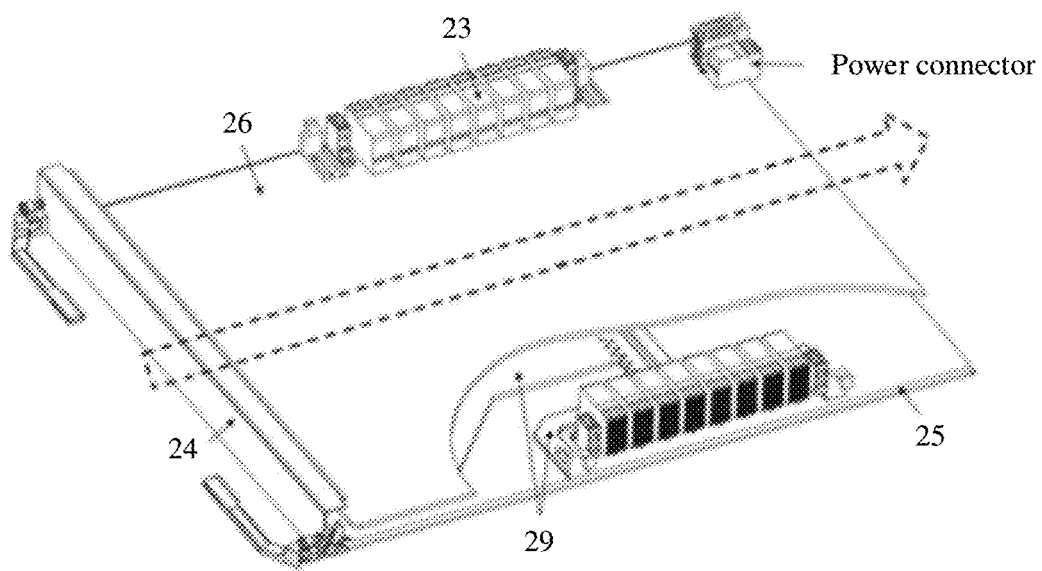
FIG. 17 is a schematic diagram of a structure of a first line board according to an example embodiment of this disclosure.

For example, as shown in FIG. 16, for the cable board, first connectors 33 located in a same slot are fastened to form a movable connector subassembly 331, and the cable board further includes guide rails 332 adapted to corresponding movable connector subassemblies 331 on two side surfaces. As shown in FIG. 17, the first line board 2 further includes the matrix insertion/removal mechanism 29 configured to hold the movable connector subassembly 331.

Figure 18:
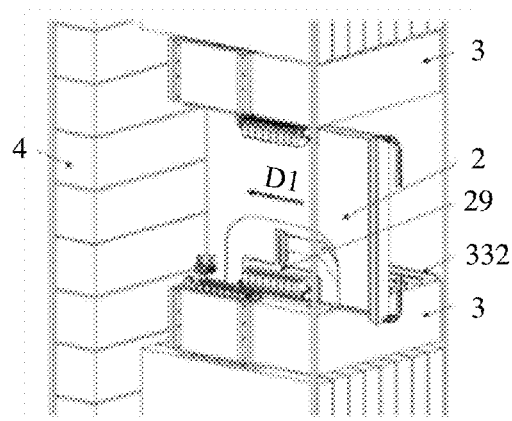
FIG. 18 is a schematic partial view of inserting a first line board according to an example embodiment of this disclosure.
Figure 19:
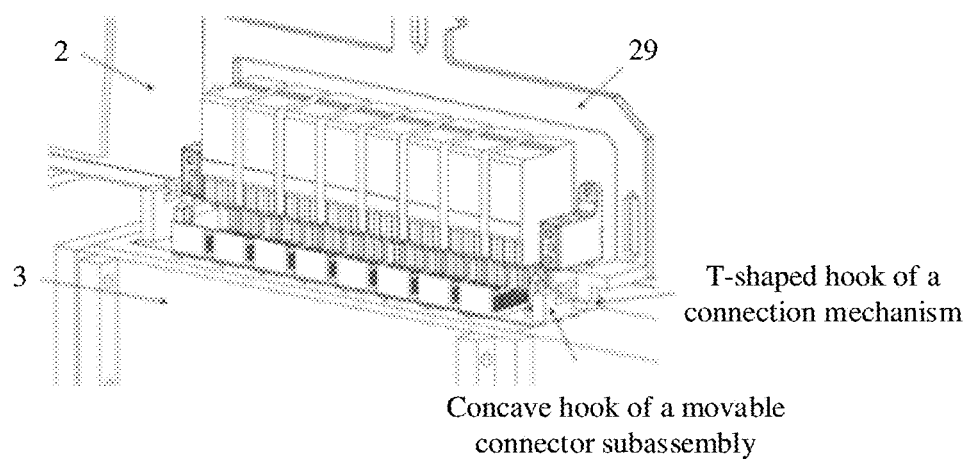
FIG. 19 is a schematic diagram of cooperation between a matrix connection mechanism and a movable connector subassembly of a second line board according to an example embodiment of this disclosure.

For a structure of the second line board 3 shown in FIG. 16, another relative insertion manner of the first line board 2 and the second line board 3 is provided. As shown in FIG. 18, the first line board 2 is normally inserted along the guide rail 332 of the chassis 1 in a direction of D1. After the first line board 2 is inserted in place in the direction of D1, the matrix insertion/removal mechanism 29 on the first line board 2 holds the movable connector subassembly 331 on the cable board. As shown in FIG. 19, the matrix insertion/removal mechanism 29 includes a T-shaped hook of the connection mechanism, and the movable connector subassembly 331 includes a concave hook of the movable connector subassembly. In a process of inserting the first line board 2 in the direction of D1, the T-shaped hook of the connection mechanism cooperates with the concave hook of the movable connector subassembly.

Figure 20:
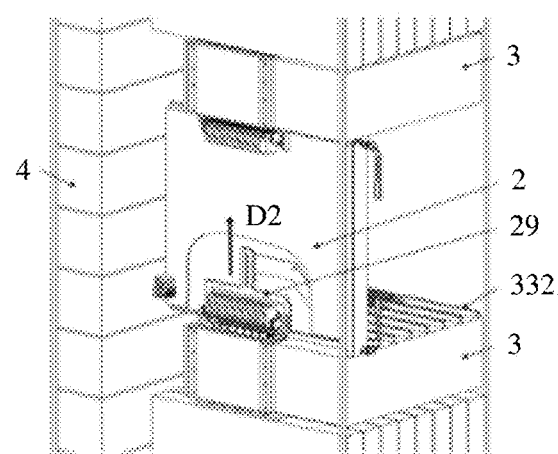
FIG. 20 is a schematic diagram of relative insertion of connectors according to an example embodiment of this disclosure.

As shown in FIG. 20, after the first line board 2 is inserted in place in the direction of D1, the matrix connection mechanism 29 drives the movable connector subassembly 331 on the second line board to move in a direction of D2, to connect the first connector 33 on the cable board and the second connector 23 on the first line board 2, so that the first line board 2 is inserted into the second line board 3. In some embodiments, the matrix connection mechanism includes the matrix insertion/removal mechanism 29, and the matrix insertion/removal mechanism 29 may be replaced with another matrix connection mechanism with a similar function.

It should be noted that cooperation between only one first line board 2 and the second line board 3 is used to illustrate the connection process in FIG. 18 to FIG. 20, and each first line board 2 can cooperate with the second line board 3 in the manners shown in FIG. 18 to FIG. 20. Details are not described one by one in this embodiment of this disclosure. In addition, the interconnection structure used in the electronic device may be applied to a blade server, and certainly, may also be applied to another electronic device with a plurality of line boards. An application scenario of the interconnection structure used in the electronic device is not limited in this embodiment of this disclosure.

In conclusion, according to the interconnection structure that is used in the electronic device and that is provided in this embodiment of this disclosure, an installation manner of the second line board and a connection manner between the first line board and the second line board in the interconnection structure are adjusted to reduce a quantity of parts on the system air duct, reduce a flow resistance of the system, and improve a heat dissipation capability of the system. In addition, an adjustment of a position of the second connector on the first line board and a relative relationship between the second connector and the second line board can also reduce high-speed link loss and improve system signal quality.

An embodiment of this disclosure further provides a method for producing an interconnection structure. The interconnection structure is an interconnection structure used in an electronic device. Taking FIG. 5 as an example, the interconnection structure used in the electronic device includes a chassis 1, a first line board 2, a second line board 3, and a heat dissipation component 4. The method for assembling the interconnection structure includes:
- disposing the heat dissipation component 4 on a first side surface of the chassis 1, where the first side surface includes a first opening;
- horizontally disposing the second line board 3 inside the chassis 1; and
- vertically inserting the first line board 2 onto a side surface of the second line board 3, where a second side surface that is of the chassis 1 and that is opposite to the first side surface includes a second opening.

In an example embodiment, as shown in FIG. 8, the interconnection structure used in the electronic device includes one second line board 3, and first line boards 2 include one group of switch fabric units (SFUs) 21 and one group of line processing units (LPUs) 22; and
- the vertically inserting the first line board 2 onto a side surface of the second line board 3 includes: vertically inserting the group of SFUs 21 onto a first side surface of the second line board 3, and vertically inserting the group of LPUs 22 onto a second side surface of the second line board 3, where the first side surface and the second side surface of the second line board 3 are two opposite side surfaces, and the first side surface and the second side surface of the second line board 3 are perpendicular to the first side surface and the second side surface of the chassis 1.

In an example embodiment, as shown in FIG. 5, the interconnection structure used in the electronic device includes one second line board 3, and first line boards 2 include one group of SFUs 21 and two groups of LPUs 22; and
- the vertically inserting the first line board 2 onto a side surface of the second line board 3 includes:
- separately inserting the group of SFUs 21 and the two groups of LPUs 22 onto a same side surface of the second line board 3, where the group of SFUs 21 is located between the two groups of LPUs 22.

In an example embodiment, the interconnection structure used in the electronic device includes at least two second line boards 3, and first line boards 2 include at least one group of SFUs 21 and two groups of LPUs 22; and
- the vertically inserting the first line board 2 onto a side surface of the second line board 3 includes:
- inserting each of the at least one group of SFUs 21 between two of the at least two second line boards 3, and inserting each of the two groups of LPUs 22 onto an outer side of one of the at least two second line boards 3.

In an example embodiment, the at least two second line boards 3 include the $1^{st}$ second line board 31 and the $2^{nd}$ second line board 32, the two groups of LPUs 22 include the first group of LPUs 221 and the second group of LPUs 222, and the at least one group of SFUs 21 includes one group of SFUs 21; and
- the inserting each of the at least one group of SFUs 21 between two of the at least two second line boards 3, and inserting each of the two groups of LPUs 22 onto an outer side of one of the at least two second line boards 3 includes:
- inserting the group of SFUs 21 onto a first side surface of the $1^{st}$ second line board 31 and a second side surface of the $2^{nd}$ second line board 32; and
- inserting the first group of LPUs 221 onto a second side surface of the $1^{st}$ second line board 31, and inserting the second group of LPUs 222 onto a first side surface of the $2^{nd}$ second line board 32.

In an example embodiment, first connectors 33 configured to connect to the first line board 2 exist on two sides of the second line board 3, second connectors 23 configured to connect to the second line board 3 exist on two sides of the first line board 2, and the first line board 2 and the second line board 3 are connected to each other by using the first connectors 33 and the second connectors 23; and
- the horizontally disposing the second line board 3 inside the chassis 1 includes:
- inserting the first line board 2 in place in a disposing direction of the second line board 3, and enabling the second connectors 23 to cooperate with the first connectors 33 on the second line board 3, so that the first line board 2 is inserted relative to the second line board 3.

In this disclosure, the second line board is a motherboard, a main board, or a backplane.

It should be noted that in addition to the foregoing manners, the interconnection structure that is used in the electronic device and that is provided in this embodiment of this disclosure further includes another structure, as described in the foregoing detailed descriptions of the interconnection structure. For a method for assembling each interconnection structure, also refer to the descriptions in the foregoing embodiments of the interconnection structure.

The foregoing descriptions are merely embodiments of this disclosure, but are not intended to limit this disclosure. Any modification, equivalent replacement, or improvement made without departing from the spirit and principle of this disclosure shall fall within the protection scope of this disclosure.

What is claimed is:

1. An interconnection structure for use in an electronic device, the interconnection structure comprising a chassis, at least one first line board, a heat dissipation component, and at least one second line board, wherein
   the heat dissipation component is disposed on a first side surface of the chassis, the first side surface comprises a first opening, the second line board is horizontally disposed inside the chassis, the first line board is vertically inserted onto a side surface of the second line board, and a second side surface that is of the chassis and that is opposite to the first side surface comprises a second opening;

the at least one first line board comprises at least two first line boards, and the first line boards comprise one group of switch fabric units (SFUs) and one group of line processing units (LPUs); and the group of SFUs is vertically inserted onto a first side surface of the second line board, the group of LPUs is vertically inserted onto a second side surface of the second line board, the first side surface and the second side surface of the second line board are two opposite side surfaces, and the first side surface and the second side surface of the second line board are perpendicular to the first side surface and the second side surface of the chassis.

2. The interconnection structure according to claim 1, wherein first connectors configured to connect to the first line board exist on two sides of the second line board, second connectors configured to connect to the second line board exist on two sides of the first line board, and the first line board and the second line board are connected to each other by using the first connectors and the second connectors.

3. The interconnection structure according to claim 2, wherein the second line board comprises at least one of a printed circuit board (PCB) and a cable board.

4. The interconnection structure according to claim 3, wherein the first connectors configured to connect to the first line board exist on two side surfaces of the PCB.

5. The interconnection structure according to claim 1, wherein the second line board is one of: a motherboard, a backplane and a main board.

6. An electronic device, comprising the interconnection structure of claim 1.

7. An interconnection structure for use in an electronic device, the interconnection structure comprising a chassis, at least one first line board, a heat dissipation component, and at least one second line board, wherein the heat dissipation component is disposed on a first side surface of the chassis, the first side surface comprises a first opening, the second line board is horizontally disposed inside the chassis, the first line board is vertically inserted onto a side surface of the second line boards, and a second side surface that is of the chassis and that is opposite to the first side surface comprises a second opening;

the at least one second line board comprises at least two second line boards and the at least one first line board comprises at least two first line boards, and the first line boards comprise at least one group of SFUs and two groups of LPUs; and each of the at least one group of SFUs is inserted between two of the at least two second line boards, and each of the two groups of LPUs is inserted onto an outer side of one of the at least two second line boards.

8. The interconnection structure according to claim 7, wherein the at least two second line boards comprise a $1^{st}$ second line board and a $2^{nd}$ second line board, the two groups of LPUs comprise a first group of LPUs and a second group of LPUs, and the at least one group of SFUs comprises one group of SFUs;

the group of SFUs is inserted onto a first side surface of the $1^{st}$ second line board and a second side surface of the $2^{nd}$ second line board; and the first group of LPUs is inserted onto a second side surface of the $1^{st}$ second line board, and the second group of LPUs is inserted onto a first side surface of the $2^{nd}$ second line board.

9. An interconnection structure for use in an electronic device, the interconnection structure comprising a chassis, at least one first line board, a heat dissipation component, and at least one second line board, wherein the heat dissipation component is disposed on a first side surface of the chassis, the first side surface comprises a first opening, the second line board is horizontally disposed inside the chassis, the first line board is vertically inserted onto a side surface of the second line board, and a second side surface that is of the chassis and that is opposite to the first side surface comprises a second opening;

first connectors configured to connect to the first line board exist on two sides of the second line board, second connectors configured to connect to the second line board exist on two sides of the first line board, and the first line board and the second line board are connected to each other by using the first connectors and the second connectors;

the first line board comprises a panel mechanical part, a baseplate mechanical part, a printed circuit board (PCB) located on the baseplate mechanical part, at least one second connector board, and a PCB board connector; and the second connector board has the second connectors connected to the second line board, and the second connectors are connected to the PCB by using a cable; and the PCB board connector is disposed on a first side surface of the baseplate mechanical part, the panel mechanical part is connected to a second side surface of the baseplate mechanical part, the second connector board is separately disposed on a third side surface and a fourth side surface of the baseplate mechanical part, the second side surface of the baseplate mechanical part is opposite to the first side surface of the baseplate mechanical part, and the third side surface of the baseplate mechanical part is opposite to the fourth side surface of the baseplate mechanical part.

10. The interconnection structure according to claim 9, wherein the PCB has a cable connector, and the PCB is connected to a cable between the second connectors by using the cable connector.

11. An interconnection structure for use in an electronic device, the interconnection structure comprising a chassis, at least one first line board, a heat dissipation component, and at least one second line board, wherein the heat dissipation component is disposed on a first side surface of the chassis, the first side surface comprises a first opening, the second line board is horizontally disposed inside the chassis, the first line board is vertically inserted onto a side surface of the second line board, and a second side surface that is of the chassis and that is opposite to the first side surface comprises a second opening;

first connectors configured to connect to the first line board exist on two sides of the second line board, second connectors configured to connect to the second line board exist on two sides of the first line board, and the first line board and the second line board are connected to each other by using the first connectors and the second connectors;

the second line board comprises at least one of the printed circuit board (PCB) and a cable board; and the cable board comprises a second line board mechanical part, the first connectors configured to connect to the first line board exist on two side surfaces of the second line board mechanical part, and the first connectors on the two side surfaces of the second line board mechanical part are connected to each other by using a cable.

12. The interconnection structure according to claim 11, wherein the first connectors located in a same slot are fastened to form a movable connector subassembly, and the cable board further comprises guide rails adapted to corresponding movable connector subassemblies on two side surfaces; and the first line board further comprises a matrix connection mechanism configured to hold the movable connector subassembly.

13. A method for assembling an interconnection structure, wherein the interconnection structure is for use in an electronic device, and the interconnection structure comprises a chassis, at least one first line board, a heat dissipation component, and at least one second line board; and the method comprises:
disposing the heat dissipation component on a first side surface of the chassis, wherein the first side surface comprises a first opening;
horizontally disposing the second line board inside the chassis; and
vertically inserting the first line board onto a side surface of the second line board, wherein a second side surface that is of the chassis and that is opposite to the first side surface comprises a second opening;
wherein the at least one first line board comprises at least two first line boards, and the first line boards comprise one group of switch fabric units (SFUs) and one group of line processing units (LPUs); and
the vertically inserting of the at least one of first line board onto the side surface of the second line board comprises:
vertically inserting the group of SFUs onto a first side surface of the second line board, and vertically inserting the group of LPUs onto a second side surface of the second line board, wherein the first side surface and the second side surface of the second line board are two opposite side surfaces, and the first side surface and the second side surface of the second line board are perpendicular to the first side surface and the second side surface of the chassis.

14. The method according to claim 13, wherein first connectors configured to connect to the first line board exist on two sides of the second line board, second connectors configured to connect to the second line board exist on two sides of the first line board, and the first line board and the second line board are connected to each other by using the first connectors and the second connectors; and the horizontally disposing of the second line board inside the chassis comprises:
inserting the first line board in place in a disposing direction of the second line board, and enabling the second connectors to cooperate with the first connectors on the second line board, so that the first line board is inserted relative to the second line board.

15. A method for assembling an interconnection structure, wherein the interconnection structure is for use in an electronic device, and the interconnection structure comprises a chassis, at least one first line board, a heat dissipation component, and at least one second line board; and the method comprises:
disposing the heat dissipation component on a first side surface of the chassis, wherein the first side surface comprises a first opening;
horizontally disposing the second line board inside the chassis; and
vertically inserting the first line board onto a side surface of the second line board, wherein a second side surface that is of the chassis and that is opposite to the first side surface comprises a second opening;
wherein the at least one second line board comprises at least two second line boards and the at least one first line board comprises at least two first line boards, and the first line boards comprise at least one group of SFUs and two groups of LPUs; and
the vertically inserting of the at least one of first line board onto the side surface of the second line board comprises:
inserting each of the at least one group of SFUs between two of the at least two second line boards, and inserting each of the two groups of LPUs onto an outer side of one of the at least two second line boards.

16. The method according to claim 15, wherein the at least two second line boards comprise a $1^{st}$ second line board and a $2^{nd}$ second line board, the two groups of LPUs comprise the first group of LPUs and the second group of LPUs, and the at least one group of SFUs comprises one group of SFUs; and the inserting of each of the at least one group of SFUs between two of the at least two second line boards, and the inserting of each of the two groups of LPUs onto the outer side of one of the at least two second line boards comprises:
inserting the group of SFUs onto a first side surface of the $1^{st}$ second line board and a second side surface of the $2^{nd}$ second line board; and
inserting the first group of LPUs onto a second side surface of the $1^{st}$ second line board, and inserting the second group of LPUs onto a first side surface of the $2^{nd}$ second line board.

* * * * *